US007787641B2

(12) United States Patent
Chen

(10) Patent No.: US 7,787,641 B2
(45) **Date of Patent: *Aug. 31, 2010**

(54) SOUND REPRODUCING SYSTEM FOR USE WITH MULTIPLE ROOMS

(76) Inventor: Chen-Lee Chen, 56, Lane 507, Jungshan Rd., Taoyuan City (TW)

(*) Notice: Subject to any disclaimer, the term of this patent is extended or adjusted under 35 U.S.C. 154(b) by 1492 days.

This patent is subject to a terminal disclaimer.

(21) Appl. No.: 11/141,084

(22) Filed: May 31, 2005

(65) Prior Publication Data

US 2006/0269081 A1 Nov. 30, 2006

(51) Int. Cl.

| | |
|---|---|
| ***H03G 3/00*** | (2006.01) |
| ***H03G 9/00*** | (2006.01) |
| ***H03G 5/00*** | (2006.01) |
| ***H04B 3/00*** | (2006.01) |
| ***H04R 37/00*** | (2006.01) |
| ***H04R 3/00*** | (2006.01) |
| ***G06F 17/00*** | (2006.01) |

(52) U.S. Cl. ....................... 381/107; 381/102; 381/103; 381/104; 381/109; 381/108; 381/77; 381/80; 381/81; 381/85; 381/122; 381/123; 700/94

(58) Field of Classification Search ......... 381/102–109, 381/77–82, 85, 122, 123; 455/116; 700/94
See application file for complete search history.

(56) References Cited

U.S. PATENT DOCUMENTS

| | | | |
|---|---|---|---|
| 5,046,107 A * | 9/1991 | Iwamatsu | 381/107 |
| 5,852,769 A * | 12/1998 | Ahmed et al. | 455/116 |
| 2007/0003078 A1* | 1/2007 | Escott et al. | 381/107 |
| 2008/0085015 A1* | 4/2008 | Chen | 381/107 |

* cited by examiner

*Primary Examiner*—Devona E Faulk
(74) *Attorney, Agent, or Firm*—Alan Kamrath; Kamrath & Associates PA

(57) ABSTRACT

A sound reproducing system for use with multiple rooms includes a main control unit, and at least one secondary control unit. Thus, the respective automatic level control circuit maintains the voice signal output at a constant level, the respective power amplification circuit of the main control unit converts the voice signal into a larger voice signal, the volume control circuit of the respective secondary control unit converts the larger voice signal and the noise produced during transmission into a smaller voice signal, and the power amplification circuit of the respective secondary control unit converts the smaller voice signal into a larger voice signal output, thereby producing a voice signal output with a higher quality.

13 Claims, 3 Drawing Sheets

SOUND REPRODUCING SYSTEM FOR USE WITH MULTIPLE ROOMS

BACKGROUND OF THE INVENTION

1. Field of the Invention

The present invention relates to a sound reproducing system, and more particularly to a sound reproducing system for use with multiple rooms.

2. Description of the Related Art

A conventional sound reproducing system comprises a speaker selector that is connected to each of a plurality of speakers mounted in a plurality of rooms of each floor, so that the voice source from the main control room can be transmitted to each of the separate rooms by the respective speaker. However, all of the rooms accommodate the same voice source, so that the people located at different rooms have to accept the same voice source and cannot select their favorite voice sources, thereby limiting the versatility of the conventional sound reproducing system.

SUMMARY OF THE INVENTION

The primary objective of the present invention is to provide a sound reproducing system for use with multiple rooms.

Another objective of the present invention is to provide a sound reproducing system, wherein the respective automatic level control circuit maintains the voice signal output at a constant level, the respective power amplification circuit of the main control unit converts the voice signal into a larger voice signal, the volume control circuit of the respective secondary control unit converts the larger voice signal and the noise produced during transmission into a smaller voice signal, and the power amplification circuit of the respective secondary control unit converts the smaller voice signal into a larger voice signal output, thereby producing a voice signal output with a higher quality.

Further benefits and advantages of the present invention will become apparent after a careful reading of the detailed description with appropriate reference to the accompanying drawings.

DETAILED DESCRIPTION OF THE INVENTION

Figure 1:
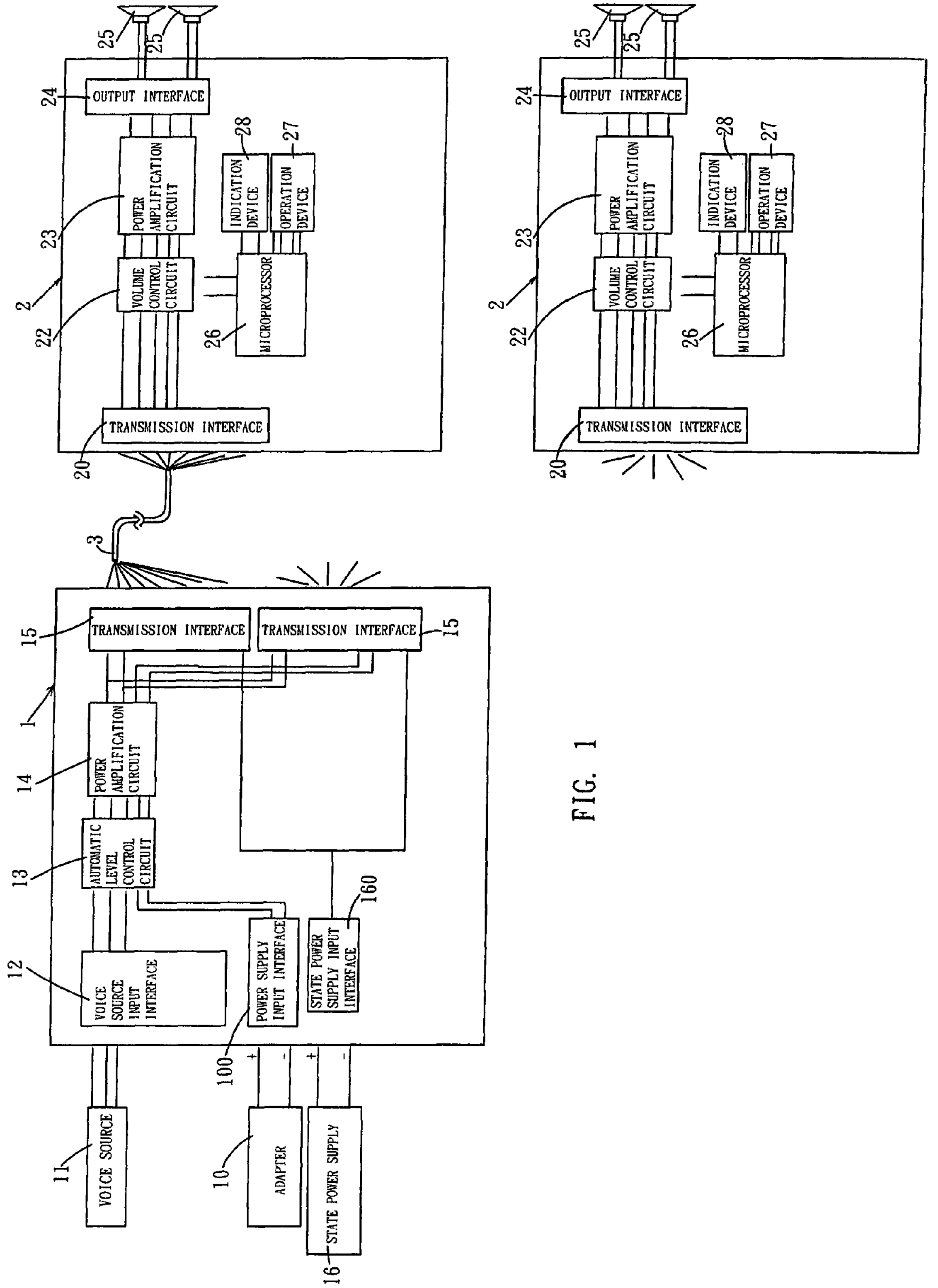
FIG. 1 is a block diagram of a sound reproducing system in accordance with the preferred embodiment of the present invention.

Referring to the drawings and initially to FIG. 1, a sound reproducing system in accordance with the preferred embodiment of the present invention comprises a main control unit 1, and a predetermined number of secondary control units 2.

The main control unit 1 includes a power supply input interface 100 connected to an external adapter 10, a voice source input interface 12 connected to at least one voice source 11, at least one automatic level control circuit 13 connected to the voice source input interface 12 and corresponding to the voice source 11, at least one power amplification circuit 14 connected to the automatic level control circuit 13, and at least one transmission interface 15 connected to the power amplification circuit 14. The automatic level control circuit 13 is used to maintain the voice signal output at a constant level automatically.

Each of the secondary control units 2 includes a transmission interface 20 connected to the respective transmission interface 15 of the main control unit 1 by a wire 3, a volume control circuit 22 connected to the transmission interface 20, a power amplification circuit 23 connected to the volume control circuit 22, an output interface 24 connected to the power amplification circuit 23 and connected to at least one external loudspeaker 25, a microprocessor 26 connected to the volume control circuit 22, an operation device 27 connected to the microprocessor 26, and an indication device 28 connected to the microprocessor 26. In the preferred embodiment of the present invention, the operation device 27 is a push button that is operable to control the volume, and the indication device 28 is a digital or dialogue indicator that is used to indicate the volume.

Figure 2:
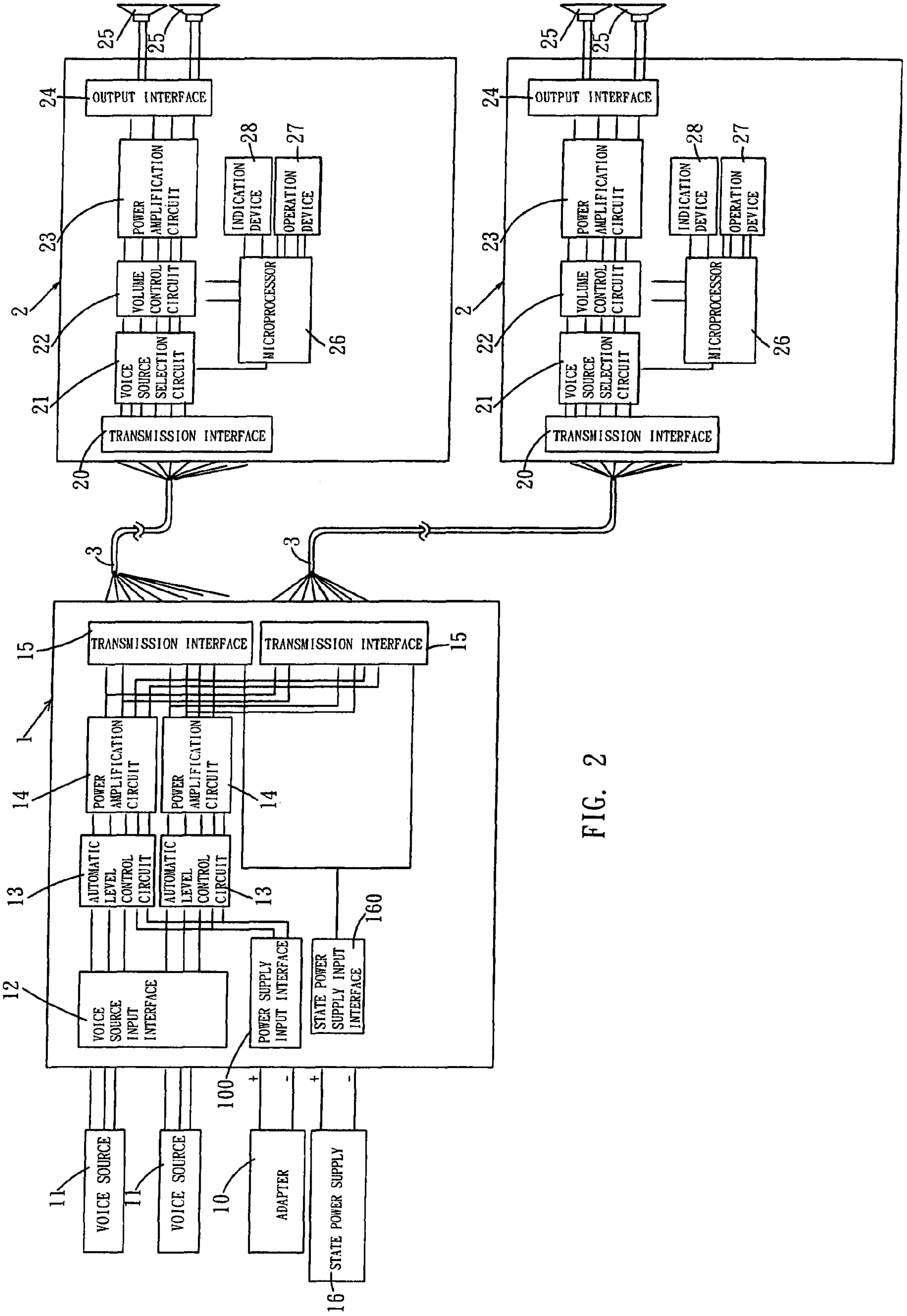
FIG. 2 is a block diagram of a sound reproducing system in accordance with another preferred embodiment of the present invention.

Referring to FIG. 2, the main control unit 1 includes an adapter 10, a voice source input interface 12 connected to a plurality of (preferably two) voice sources 11, a plurality of (preferably two) automatic level control circuits 13 each connected to the voice source input interface 12 and each corresponding to the respective voice source 11, a plurality of (preferably two) power amplification circuits 14 each connected to the respective automatic level control circuit 13, and a plurality of (preferably two) transmission interfaces 15 each connected to the respective power amplification circuit 14.

Each of the secondary control units 2 includes a transmission interface 20 connected to the respective transmission interface 15 of the main control unit 1 by a wire 3, a voice source selection circuit 21 connected to the transmission interface 20, a volume control circuit 22 connected to the voice source selection circuit 21, a power amplification circuit 23 connected to the volume control circuit 22, an output interface 24 connected to the power amplification circuit 23 and connected to at least one external loudspeaker 25, a microprocessor 26 connected to the voice source selection circuit 21 and the volume control circuit 22, an operation device 27 connected to the microprocessor 26, and an indication device 28 connected to the microprocessor 26. In the preferred embodiment of the present invention, the operation device 27 is a push button that is operable to select the voice source and to control the volume, and the indication device 28 is a digital or dialogue indicator that is used to indicate the voice source and to indicate the volume.

In practice, the main control unit 1 is connected to different voice sources 11, such as the CD, MD, tape, DCD, VCR and the like, and each of the secondary control units 2 is placed at a determined position, such as one of the rooms of each floor. Thus, the operation device 27 is operated to control the microprocessor 26 which controls the voice source selection circuit 21 and the volume control circuit 22 to select the respective voice source input and the respective volume output to produce a selective voice signal. At this time, the indication device 28 indicates the selective voice signal. Then, the respective automatic level control circuit 13 of the main control unit 1 maintains the voice signal output at a constant level automatically. Then, the respective power amplification circuit 14 converts the voice signal into a larger voice signal. Then, the respective transmission interface 15 outputs the larger voice signal which is transmitted into the transmission interface 20 of the respective secondary control unit 2 by the respective wire 3 or by RF transmission. Then, the volume control circuit 22 converts the larger voice signal into a smaller voice signal. Then, the power amplification circuit 23 converts the smaller voice signal into a larger voice signal which is transmitted through the output interface 24 into the external loudspeaker 25 so that the external loudspeaker 25 emits the voice outward.

In such as a manner, each of the secondary control units 2 placed at a determined position can be used to select the respective voice source output. Thus, the respective automatic level control circuit 13 maintains the voice signal output at a constant level, the respective power amplification circuit 14 of the main control unit 1 converts the voice signal into a larger voice signal, the volume control circuit 22 of the respective secondary control unit 2 converts the larger voice signal and the noise produced during transmission into a smaller voice signal, and the power amplification circuit 23 of the respective secondary control unit 2 converts the smaller voice signal into a larger voice signal output, thereby producing a voice signal output with a higher quality.

Figure 3:
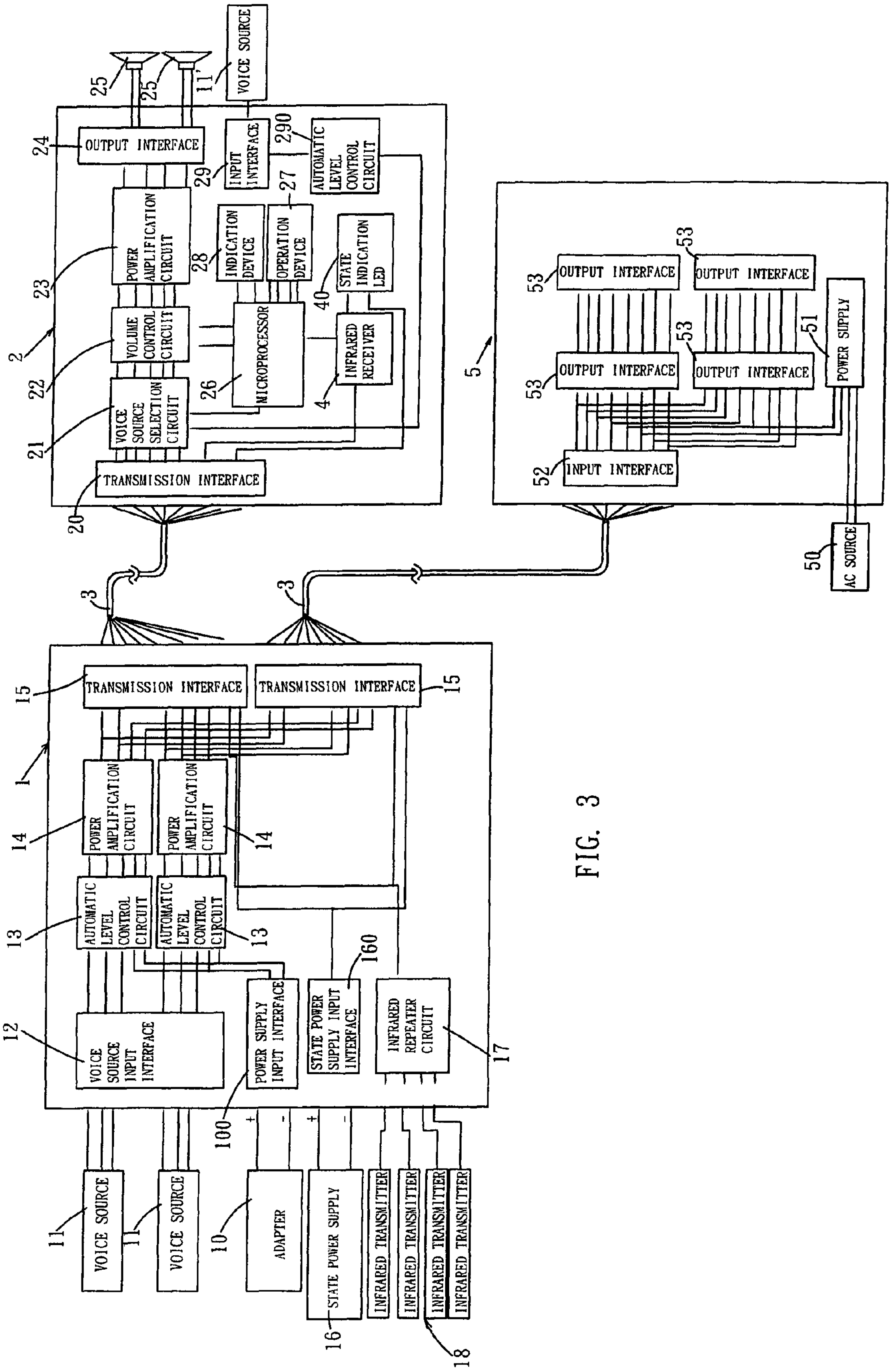
FIG. 3 is a block diagram of a sound reproducing system in accordance with another preferred embodiment of the present invention.

Referring to FIG. 3, the secondary control unit 2 further includes an infrared receiver 4 connected to the microprocessor 26 and the transmission interface 20, and a state indication LED 40 connected to the infrared receiver 4 and the transmission interface 20 so that the state indication LED 40 is connected to a state power supply input interface 160 of the main control unit 1. The state power supply input interface 160 is connected to a state power supply 16.

The main control unit 1 further includes an infrared repeater circuit 17 connected to the respective transmission interface 15, and a plurality of external infrared transmitters 18 each connected to the infrared repeater circuit 17. Thus, the infrared repeater circuit 17 is connected to the infrared receiver 4 of the secondary control unit 2 by the respective transmission interface 15 to remote control the voice sources 11 by infrared transmission so as to control operation of the voice sources 11, such as selection, fast forward, skip or the like.

The sound reproducing system further comprises an expansion seat 5 connected to the respective transmission interface 15 of the main control unit 1. The expansion seat 5 includes a power supply 51 connected to an external AC source 50, an input interface 52 connected to the respective transmission interface 15 of the main control unit 1, and a plurality of output interfaces 53 connected to the input interface 52 and connected to a plurality of secondary control units 2, so that the expansion seat 5 is connected to the main control unit 1 and a plurality of secondary control units 2 so as to expand the number of the secondary control units 2. In the preferred embodiment of the present invention, the input interface 52 and the output interfaces 53 of the expansion seat 5 are connecting terminals that are respectively connected to the respective transmission interface 15 of the main control unit 1 and the transmission interfaces 20 of the secondary control units 2 by a wire, such as a network line. Alternatively, the input interface 52 and the output interfaces 53 of the expansion seat 5 are radio transceivers that are respectively connected to the respective transmission interface 15 of the main control unit 1 and the transmission interfaces 20 of the secondary control units 2 in a wireless manner.

The secondary control unit 2 further includes an input interface 29 connected to an external voice source 11', and an automatic level control circuit 290 connected to the input interface 29 and the voice source selection circuit 21. Thus, the external voice source 11' is connected to the secondary control unit 2 so that the secondary control unit 2 is used conveniently.

In addition, the main control unit 1, the expansion seat 5 and the secondary control unit 2 are transmitted in a wire or wireless manner. For example, the respective transmission interface 15 of the main control unit 1, the input interface 52 of the expansion seat 5 and the transmission interfaces 20 of the secondary control units 2 are connecting terminals that are respectively connected by a wire 3, such as the CAT-5 network line, thereby facilitating assembly of the sound reproducing system. Alternatively, the respective transmission interface 15 of the main control unit 1, the input interface 52 of the expansion seat 5 and the transmission interfaces 20 of the secondary control units 2 are radio transceivers that are respectively connected in a wireless manner to transmit the voice signal.

Although the invention has been explained in relation to its preferred embodiment(s) as mentioned above, it is to be understood that many other possible modifications and variations can be made without departing from the scope of the present invention. It is, therefore, contemplated that the appended claim or claims will cover such modifications and variations that fall within the true scope of the invention.

What is claimed is:

1. A sound reproducing system, comprising a main control unit, and at least one secondary control unit, wherein:

the main control unit includes an adapter, a voice source input interface connected to at least one voice source, at least one automatic level control circuit connected to the voice source input interface and corresponding to the voice source, at least one first power amplification circuit connected to the automatic level control circuit, and at least one first transmission interface connected to the first power amplification circuit;

the secondary control unit includes a second transmission interface connected to the respective first transmission interface of the main control unit, a volume control circuit connected to the second transmission interface, a second power amplification circuit connected to the volume control circuit, an output interface connected to the second power amplification circuit and connected to at least one external loudspeaker, a microprocessor connected to the volume control circuit, an operation device connected to the microprocessor, and an indication device connected to the microprocessor;

the operation device is operated to control the microprocessor which controls the volume control circuit to output a voice signal from the voice source with a determined volume, the indication device indicates the voice signal, the respective automatic level control circuit of the main control unit maintains the voice signal output at a constant level, the respective first power amplification circuit of the main control unit converts the voice signal into a larger voice signal, the respective first transmission interface of the main control unit outputs the larger voice signal which is transmitted into the second transmission interface of the respective secondary control unit, the volume control circuit of the respective secondary control unit converts the larger voice signal into a smaller voice signal, and the second power amplification circuit of the respective secondary control unit converts the smaller voice signal into a larger voice signal which is transmitted through the output interface of the respective secondary control unit into the external loudspeaker so that the external loudspeaker emits the voice outward.

2. The sound reproducing system in accordance with claim 1, wherein:

the secondary control unit further includes a voice source selection circuit connected between the second transmission interface and the volume control circuit and connected to the microprocessor;

the operation device is operated to control the microprocessor which controls the voice source selection circuit and the volume control circuit to select a respective voice source input and a respective volume output to produce a selective voice signal, the indication device indicates the selective voice signal, the respective automatic level control circuit of the main control unit maintains the voice signal output at a constant level, the respective first power amplification circuit of the main control unit converts the voice signal into a larger voice signal, the respective first transmission interface of the main control unit outputs the larger voice signal which is transmitted into the second transmission interface of the respective secondary control unit, the volume control circuit converts the larger voice signal into a smaller voice signal, the second power amplification circuit of the respective secondary control unit converts the smaller voice signal into a larger voice signal which is transmitted through the output interface into the external loudspeaker so that the external loudspeaker emits the voice outward.

3. The sound reproducing system in accordance with claim 1, wherein the secondary control unit further includes an infrared receiver connected to the microprocessor and the second transmission interface, and a state indication LED connected to the infrared receiver and the second transmission interface so that the state indication LED is connected to a state power supply input interface of the main control unit.

4. The sound reproducing system in accordance with claim 2, wherein the secondary control unit further includes an infrared receiver connected to the microprocessor and the second transmission interface, and a state indication LED connected to the infrared receiver and the second transmission interface so that the state indication LED is connected to a state power supply input interface of the main control unit.

5. The sound reproducing system in accordance with claim 4, wherein the main control unit further includes an infrared repeater circuit connected to the respective transmission interface, and a plurality of external infrared transmitters each connected to the infrared repeater circuit, the infrared repeater circuit is connected to the infrared receiver of the secondary control unit by the respective first transmission interface to remote control the voice sources by infrared transmission so as to control operation of the voice sources.

6. The sound reproducing system in accordance with claim 2, wherein the secondary control unit further includes an input interface connected to an external voice source, and an automatic level control circuit connected to the input interface and the voice source selection circuit.

7. The sound reproducing system in accordance with claim 1, wherein the respective first transmission interface of the main control unit and the second transmission interfaces of the secondary control units are connecting terminals that are respectively connected by a wire.

8. The sound reproducing system in accordance with claim 7, wherein the wire is a CAT-5 network line.

9. The sound reproducing system in accordance with claim 1, wherein the respective first transmission interface of the main control unit and the second transmission interfaces of the secondary control units are radio transceivers that are respectively connected in a wireless manner to transmit the voice signal.

10. The sound reproducing system in accordance with claim 1, further comprising an expansion seat connected to the respective first transmission interface of the main control unit, wherein the expansion seat includes a power supply connected to an external AC source, an input interface connected to the respective first transmission interface of the main control unit, and a plurality of output interfaces connected to the input interface and connected to a plurality of secondary control units, so that the expansion seat is connected to the main control unit and a plurality of secondary control units so as to expand the number of the secondary control units.

11. The sound reproducing system in accordance with claim 10, wherein the input interface and the output interfaces of the expansion seat are connecting terminals that are respectively connected to the respective first transmission interface of the main control unit and the second transmission interfaces of the secondary control units by a wire.

12. The sound reproducing system in accordance with claim 11, wherein the wire is a CAT-5 network line.

13. The sound reproducing system in accordance with claim 10, wherein the input interface and the output interfaces of the expansion seat are radio transceivers that are respectively connected to the first transmission interface of the main control unit and the second transmission interfaces of the secondary control units in a wireless manner.

* * * * *